United States Patent [19]

Ikeda et al.

[11] Patent Number: 4,852,133
[45] Date of Patent: Jul. 25, 1989

[54] X-RAY LITHOGRAPHY APPARATUS

[75] Inventors: Minoru Ikeda; Ryuichi Funatsu; Yukio Kembo, all of Yokohama; Motoya Taniguchi, Kamakura, all of Japan

[73] Assignee: Hitachi, Ltd., Tokyo, Japan

[21] Appl. No.: 117,499

[22] Filed: Nov. 6, 1987

[30] Foreign Application Priority Data

Nov. 7, 1986 [JP] Japan .............................. 61-263725

[51] Int. Cl.$^4$ .............................................. G21K 5/00
[52] U.S. Cl. .................................... 378/34; 378/205; 378/206; 250/492.2
[58] Field of Search .................. 356/401; 378/34, 119, 378/205, 206; 250/492.2, 492.3, 491.1

[56] References Cited

U.S. PATENT DOCUMENTS 4,403,336  9/1983  Taniguchi et al. .................... 378/34
4,708,484  11/1987  Komeyama et al. ................. 356/401

FOREIGN PATENT DOCUMENTS 0191433  11/1983  Japan .................................... 378/34

Primary Examiner—Carolyn E. Fields
Assistant Examiner—David P. Porta
Attorney, Agent, or Firm—Antonelli, Terry & Wands

[57] ABSTRACT

An X-ray lithography apparatus for transferring a pattern formed in a mask onto a wafer by using a soft X-ray. The apparatus comprises a soft X-ray generating unit, a gas chamber connected to an X-ray exit window of the soft X-ray generating unit and filled with a gaseous medium having a high transmittivity to the X-ray, the mask being mounted within the gas chamber, a stage for positioning the wafer in opposition to the mask with a small gap therebetween, detecting optics disposed within the gas chamber for optically picking up image of alignment patterns of the mask and wafer, an imager disposed within the gas chamber for converting the image of the alignment pattern picked up by the detecting optics into a video signal, a discharging port for withdrawing from the gas chamber the gaseous medium present in the vicinity of the imager, a combination of a blower and a heat exchanged for cooling and circulating the gaseous medium withdrawn through the gas discharging port, and a charging port for feeding back to the gas chamber the gaseous medium conditioned and circulated by the blower and the heat exchanger. The discharge port, blower and heat exchanger and the charging port cooperate to prevent the temperature of the gaseous medium within the gas chamber from being increased due to heat generated by the imager means to thereby suppress drift phenomenon in the detecting optics.

4 Claims, 2 Drawing Sheets

X-RAY LITHOGRAPHY APPARATUS

BACKGROUND OF THE INVENTION

The present invention relates to an X-ray pattern transfer apparatus also referred to as the X-ray lithography apparatus for transferring a fine pattern formed in a mask to a wafer by using a soft X-ray.

As a hitherto known X-ray lithography apparatus, there can be mentioned the one disclosed in Japanese Patent Application Laid-Open No. 169242/1982 (JP-A-57-169242) which corresponds to U.S. Pat. No. 4,403,336. Referring to FIG. 3 of the accompanying drawings, this known X-ray lithography apparatus includes a gas chamber having an X-ray receiving window which is disposed on a side of an X-ray generating unit 1 where an X-ray exit window is provided. The gas chamber 2 accommodates therein a gaseous medium having a high transmissivity to the X-ray. A mask 3 having a desired pattern formed therein is mounted on the X-ray lithography apparatus 1 so as to cover an aperture formed in a wall of the gas chamber 2 at a position opposite to the X-ray receiving window. A wafer stage 5 is provided outside of the gas chamber 2 for holding a wafer 4 in an ambient atmosphere so as to be exposed to the X-ray through the mask 3, while allowing the wafer 4 to be moved relative to the mask 3.

Disposed within the gas chamber 2 is an optical system 6 which serves to aid positional alignment to be attained between the pattern of the mask and the wafer through visual observation. With a view to preventing the purity of helium gas filling the gas chamber 2 from being degraded due to admixing of the air possibly occurring upon replacement of the mask, a helium gas cylinder (bomb) 7 is provided in communication with the gas chamber 2 so that an amount of helium gas is constantly supplied to the chamber 2 with a corresponding amount of gas being discharged through a drain duct 8. However, the flow of helium gas within the chamber 2 is extremely small and can thus be neglected.

Further disposed within the gas containing chamber 2 are a light source for illumination of the viewing or detecting optics 6, a television camera 9, an optics positioning mechanism 10, a mask positioning device 11 and other. These components constitute heat generating sources within the gas chamber 2. Additionally, thermal flux produced by the soft X-ray generating unit 1 may flow into the gas chamber 2 through the X-ray exit window 12.

In the case of the hitherto known X-ray lithography apparatus reviewed above, no consideration is paid to removal of heat generated within the gas chamber 2 by the imager system and others mentioned above. Consequently, thermal distortion or deformation is likely to occur in the viewing or detecting optics, which results in occurrence of a drift of the detected values representative of the relative positions of the mask 3 and the wafer 4, giving rise to a problem that the accuracy of positional alignment is undesirably degraded. Under the circumstance, the X-ray lithography apparatus known heretofore can be used only after a warm-up operation which is continued until the temperature rise due to the heat generation has attained a saturated state. This warm-up operation usually takes several hours or more. Consequently, the X-ray lithography apparatus has to be operated continuously day and night in order to ensure a high working ratio. Further, such drift can occur when the operating condition is changed.

Parenthetically, it is noted that an X-ray lithography apparatus including means for preventing the temperature of a mask from being raised is disclosed in Japanese Patent Application Laid-Open No. 191433/1983 (JP-A-58-191433).

SUMMARY OF THE INVENTION

It is therefore an object of the present invention to provide an X-ray lithography apparatus which is protected against occurrence of drifts in the optically detected position due to temperature rise brought about by positional alignment detecting/imaging means and others and which can be operated with a high accuracy even a short time after power-on of the apparatus.

In view of the above object, it is proposed according to an aspect of the present invention an X-ray lithography apparatus which includes a gas chamber filled with a gas such as helium gas for preventing attenuation of X-ray and has a mask mounted at a position to be irradiated with the X-ray, imaging means disposed within the gas chamber for detecting an alignment mark used for alignment of a wafer with the mask, a gas discharge port provided in the gas chamber in the vicinity of the imaging means, a gas recharging port provided at such a position where the cooled gas such as helium gas or the like is circulated uniformly within the gas chamber, and a blower and a heat exchanger both provided between the gas discharge port and the gas recharging port to circulate and cool the gas such as helium gas, to thereby prevent the detecting optics from undergoing thermal deformation due to heat generated by the imaging means.

With the arrangement described above, heat generated by the imaging means is prevented from being transmitted to the interior of the gas chamber and bringing about thermal deformation of the detecting optics and other elements, whereby the mask and the wafer can be aligned with each other at an improved accuracy without being accompanied with drifts in the detected position signal.

DESCRIPTION OF THE PREFERRED EMBODIMENTS

Figure 1:
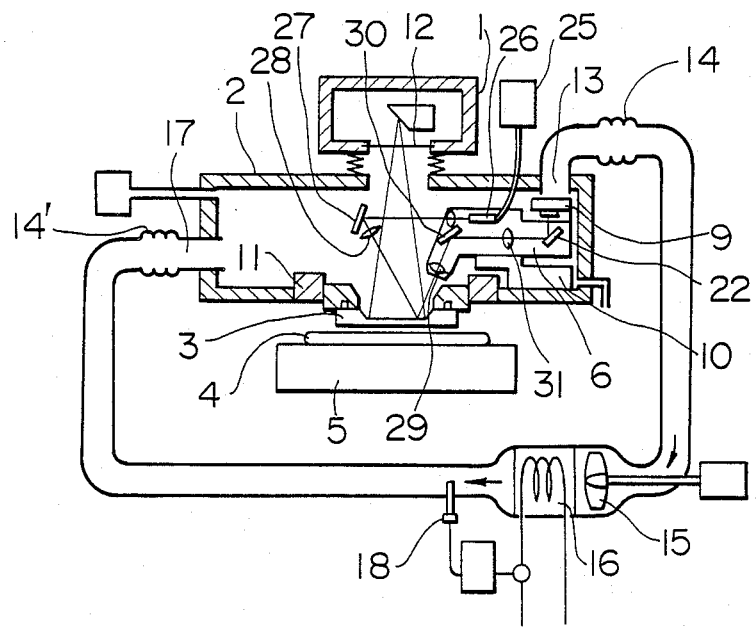
FIG. 1 is a front view showing partially in section an X-ray lithography apparatus according to an exemplary embodiment of the present invention.
Figure 3:
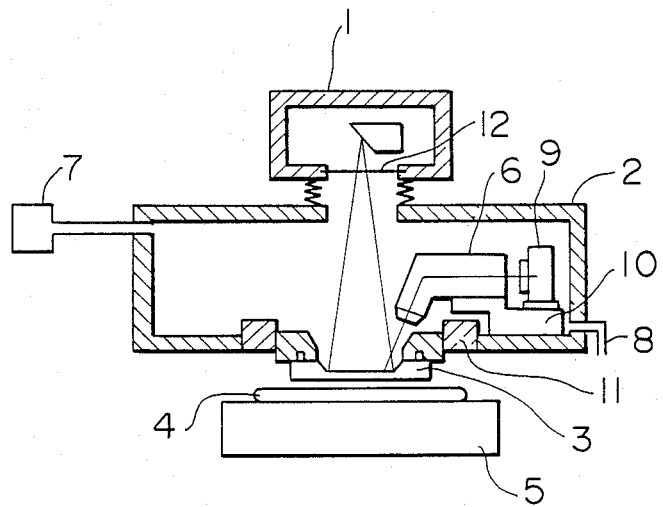
FIG. 3 is a front view showing partially in section a general arrangement of an X-ray lithography apparatus known heretofore.

Now, the present invention will be described in detail in conjunction with an illustrative embodiment by referring to FIGS. 1 and 2.

The X-ray lithography apparatus according to the invention includes a soft X-ray generating unit 1, a gas chamber 2, a wafer stage 5 and others which can be of same structures as those of the prior art lithography apparatus such as the one disclosed in the aforementioned JP-A-57-16924 (corresponding to U.S. Pat. No. 4,403,336).

As will be readily seen from the description of the prior art, if the heat generating components such as imaging unit and others can be installed outside of the gas chamber 2, cooling effect due to natural convection can be expected. However, mark detection optics 6 for allowing alignment marks of the mask and wafer to be picked up by the imaging unit 9 must be movable for adjusting its position in accordance with the sizes of masks as used by means of a positioning mechanism 10 including an X-Y stage which has a stroke greater than about 5 mm in at least one of the X- and Y-directions. Further, in view of the fact that the mask and the wafer must be positionally aligned with each other in the X-direction, Y-direction and in the angular direction 8, there are required at least three sets of the detection optics 6 and the imaging units 9, only one set of which is shown in FIG. 1 for simplification of the illustration. Additionally, a mirror 27 and an illuminating lens 28 constituting parts of illuminating optics are required to be mounted in the manner as shown in FIG. 1. Accordingly, the detection optics 6 and the imaging unit 9 are preferred to be disposed within the atmospheric gas chamber 2 in view of the hermetically sealed structure of the X-ray lithography apparatus as a whole.

On the other hand, the imaging unit 9 such as television camera constitutes a major heat generating source. Accordingly, when the imaging unit 9 is disposed within the gas chamber 2, eat generated by the imaging unit is transmitted to the gas such as helium gas or the like filling the gas chamber 2, which in turn results in a temperature rise of the gas atmosphere and hence the detection optics disposed within the gas chamber 2, bringing about the problem of drift described hereinbefore.

Under the circumstance, according to an aspect of the invention, a duct 13 is provided which opens in the gas chamber 2 at a position near the main heat generating source constituted by the imaging unit 9 realized in the form of a television camera, solid state imaging device such as charge-coupled device (CCD) or the like to be used for withdrawing under suction the helium gas from the gas chamber 2. The duct 13 is connected to a recharging duct 17 also opening in the gas chamber 2 through a flexible duct 14, a blower 15, a heat exchanger 16 and a flexible duct 14' so that the helium gas withdrawn through the discharge duct 13 is returned into the gas chamber 2 through the charging port 17. The temperature of the gas leaving the heat exchanger 16 is detected by a sensor 18 for controlling the heat transfer function of the heat exchanger 16 so that the temperature of the gas leaving the heat exchanger 16 remains constant.

Figure 2:
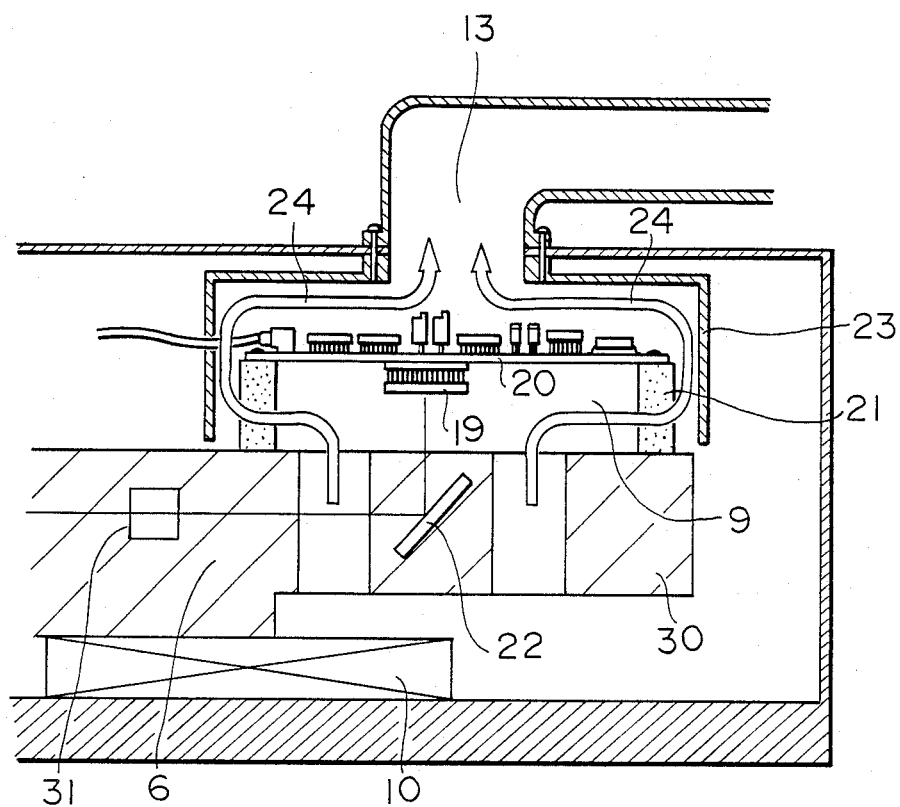
FIG. 2 is an enlarged partial view showing detection optics and imaging unit of the X-ray lithography apparatus shown in FIG. 1.

FIG. 2 shows a mounting structure of the imaging unit 9. As will be seen, the imaging unit 9 is composed of a solid state imaging device 19 and a control circuit substrate 20 and is disposed above the detecting optics 6. More specifically, the imaging unit 9 is fixedly secured to a supporting member 30 of the detecting optics 6 through an interposed heat insulation member 21. The optical axis of the detecting optics 6 is deflected upwardly by a mirror 22 so that the positioning mark image is projected onto the solid state imaging device 19. A reference numeral 25 denotes a light source for illumination which is disposed externally of the gas chamber 2. A glass fiber 26 serving for conduction of light emitted by the light source 25 has a light exit end portion which is secured on the detecting optics 9. A reference numeral 27 denotes a mirror which is so disposed that the light beam emitted from the exit end of the glass fiber 26 and reflected by the mirror 27 illuminates the alignment patterns on the mask 3 and wafer 4 in the direction inclined thereto.

The control circuit substrate 20 which is a main heat generating source is enclosed by a casing 23 having an open top connected to the discharging duct 13, whereby the ambient gas surrounding the substrate 20 is withdrawn under suction into the discharging duct 13, as is indicated by arrows 24. The charging duct 17 (FIG. 1) is preferably disposed at such a position that a uniform flow of the helium gas can take place within the gas chamber 2 in the direction toward the discharging duct 13. More preferably, a flow rectifying plate member (not shown) is provided within the gas chamber 2 for ensuring more uniform gas flow taking place within the gas chamber 2. The heat generating part of the imaging unit 9 such a television camera or the like is supported by the heat insulation material 21 to thereby prevent heat from being transmitted directly to the parts constituting the detecting optics 6.

Upon operation of the X-ray lithography apparatus of the structure described above, heat generated by the heat generating source within the gas chamber causes the temperature of the ambient helium gas to rise. However, the heated gas is immediately withdrawn through the discharging duct 13 and cooled down to a predetermined temperature level by means of the heat exchanger 16. Thus, accumulation of heat within the gas chamber 2 as well as the accompanying drift phenomenon of the alignment mark position detected by the optics 6 can be positively reduced to a minimum. Further, since the flexible ducts 14 and 14' are employed for incorporating the blower 15 in the gas recirculation path, vibration of the blower 15 is positively prevented from being transmitted to the detecting optics 6 and the mask 3, which would otherwise bring about fluctuation in the detected mark position and hence positional deviations of the mask 3 relative to the wafer 4.

In the case of the illustrative embodiment, the heat exchanger 16 is disposed adjacent to the blower 15. However, since the heat exchanger 16 scarcely produces vibration of any significant magnitude, it can be disposed at a position adjacent to the gas chamber 2 if allowable in view of the available space, wherein the heat exchanger 16 may be connected to the blower 15 by another flexible duct 14. In a further modification, the blower 15 and the heat exchanger 16 may be disposed within the gas chamber 2, wherein the blower 15 may be supported by an appropriate anti-vibration mechanism (not shown) for preventing any vibration which would otherwise be transmitted to the detecting optics.

It has been described that the amount of heat exchange is controlled or regulated in dependence on the exit temperature of the heat exchanger. However, when the heat exchanger as employed has a sufficiently large capacity, the exit temperature can be maintained constant simply by supplying a cooling water of a constant temperature to the heat exchanger. In a further version, a heater (not shown) may be additionally provided between the heat exchanger 16 and the temperature sensor 18, wherein the amount of heat generated by the heater is controlled as a function of the output signal of the sensor 18 to thereby maintain constant the temperature of the recirculated gas.

For particulars of the structures of the detecting optics 6, the imaging unit 9 and others, reference may be made to U.S. patent application No. 789,778 filed on Oct. 21, 1985.

As will now be appreciated from the foregoing description, it is possible according to the present invention to suppress drift of the alignment mark position detected by the detecting optics within a short time, whereby continuous operation of the X-ray lithography apparatus over day and night is rendered unnecessary. Further, the operating state of the X-ray lithography apparatus is stabilized rapidly upon alteration of the operating conditions. Thus, an enhanced working ratio of the apparatus can be accomplished.

We claim:

1. An X-ray lithography apparatus for transferring a pattern formed in a mask onto a wafer by using a soft X-ray, comprising:

a soft X-ray generating unit;

a gas chamber connected to an X-ray exit window of said soft X-ray generating unit and filled with a gaseous medium having a high transmittivity to the X-ray, said mask being mounted within said gas chamber;

stage means for positioning said wafer in opposition to said mask with a gap between said wafer and mask;

detecting optics disposed within said gas chamber for optically picking up an image of alignment patterns of said mask and wafer;

imaging means disposed within said gas chamber for converting the image of said alignment pattern picked up by said detecting optics into an image signal, said imaging means including a solid state imaging device and a control circuit substrate for obtaining the image signal by enabling electrical control of said solid state imaging device;

a discharging port for withdrawing from said gas chamber said gaseous medium present in the vicinity of said control circuit substrate of said imaging means, said control circuit substrate being a main heat generating source within said gas chamber;

a combination of a blower and a heat exchanger for cooling and circulating said gaseous medium withdrawn through said gas discharging port;

and a charging port for feeding back to said gas chamber said gaseous medium conditioned and circulated by said combination of blower and heat exchanger, wherein said discharge port, said combination of blower and heat exchanger and said charging port cooperate to prevent the temperature of said gaseous medium within said gas chamber from being increased due to heat generated by said control circuit substrate of the imaging means to thereby suppress a drift phenomenon in said detecting optics.

2. An X-ray lithography apparatus according to claim 1, wherein said blower is connected to said gas chamber through interposition of a resilient member so that vibration produced by said blower is prevented from being transmitted to said gas chamber.

3. An X-ray lithography apparatus according to claim 1, wherein said heat exchanger and said blower are disposed externally of said gas chamber and are interconnected by ducts to said discharge port and said charging port, respectively.

4. An X-ray lithography apparatus according to claim 1, wherein said detecting optics and said imaging means are disposed on an X-Y table.

* * * * *